(12) United States Patent
Shek et al.

(10) Patent No.: US 11,566,325 B2
(45) Date of Patent: Jan. 31, 2023

(54) SILICON CARBONITRIDE GAPFILL WITH TUNABLE CARBON CONTENT

(71) Applicant: Applied Materials, Inc., Santa Clara, CA (US)

(72) Inventors: Mei-Yee Shek, Palo Alto, CA (US); Bhargav S. Citla, Fremont, CA (US); Joshua Rubnitz, Monte Sereno, CA (US); Jethro Tannos, San Jose, CA (US); Chentsau Chris Ying, Cupertino, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/120,494

(22) Filed: Dec. 14, 2020

(65) Prior Publication Data
US 2021/0189555 A1 Jun. 24, 2021

Related U.S. Application Data

(60) Provisional application No. 62/951,188, filed on Dec. 20, 2019.

(51) Int. Cl.
*C23C 16/36* (2006.01)
*C01B 21/082* (2006.01)
(Continued)

(52) U.S. Cl.
CPC .......... *C23C 16/36* (2013.01); *C01B 21/0828* (2013.01); *C09D 1/00* (2013.01); *C23C 16/4408* (2013.01); *C23C 16/50* (2013.01)

(58) Field of Classification Search
CPC ...... C23C 16/36; C23C 16/4408; C23C 16/50
See application file for complete search history.

(56) References Cited

U.S. PATENT DOCUMENTS 10,096,466 B2 10/2018 Xue et al.
2008/0146007 A1 6/2008 Balseanu et al.
(Continued)

OTHER PUBLICATIONS

PCT International Search Report and Written Opinion in PCT/US2020/065521 dated Apr. 14, 2021, 12 pages.

*Primary Examiner* — Elizabeth A Burkhart
(74) *Attorney, Agent, or Firm* — Servilla Whitney LLC

(57) ABSTRACT

Methods for plasma enhanced chemical vapor deposition (PECVD) of silicon carbonitride films are described. A flowable silicon carbonitride film is formed on a substrate surface by exposing the substrate surface to a precursor and a reactant, the precursor having a structure of general formula (I) or general formula (II)

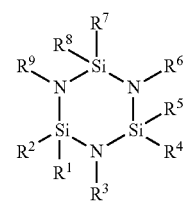

(I)

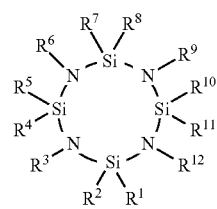

(II)

wherein $R^1, R^2, R^3, R^4, R^5, R^6, R^7, R^8, R^9, R^{10}, R^{11}$, and $R^{12}$ are independently selected from hydrogen (H), substituted (Continued)

or unsubstituted alkyl, substituted or unsubstituted alkoxy, substituted or unsubstituted vinyl, silane, substituted or unsubstituted amine, or halide; purging the processing chamber of the silicon precursor, and then exposing the substrate to an ammonia plasma.

16 Claims, 2 Drawing Sheets

(51) Int. Cl.
*C23C 16/44* (2006.01)
*C23C 16/50* (2006.01)
*C09D 1/00* (2006.01)

(56) References Cited

U.S. PATENT DOCUMENTS

| | | |
|---|---|---|
| 2013/0189841 A1 | 7/2013 | Balseanu et al. |
| 2013/0217240 A1* | 8/2013 | Mallick ............ H01L 21/02274 438/778 |
| 2014/0030448 A1* | 1/2014 | Bowen ................... C23C 16/30 427/578 |
| 2015/0126045 A1* | 5/2015 | Chatterjee ......... H01L 21/02211 438/793 |
| 2016/0148837 A1 | 5/2016 | Yim et al. |
| 2016/0172239 A1 | 6/2016 | Padhi et al. |
| 2017/0114465 A1* | 4/2017 | Kalutarage ....... H01L 21/02271 |
| 2017/0335449 A1* | 11/2017 | Li ..................... H01L 21/02222 |

* cited by examiner

SILICON CARBONITRIDE GAPFILL WITH TUNABLE CARBON CONTENT

CROSS-REFERENCE TO RELATED APPLICATIONS

This application claims priority to U.S. Provisional Application No. 62/951,188, filed Dec. 20, 2019, the entire disclosure of which is hereby incorporated by reference herein.

TECHNICAL FIELD

Embodiments of the disclosure generally relate to silicon nitride film deposition. More particularly, embodiments of the disclosure are directed to the deposition of silicon carbonitride films with tunable carbon content.

BACKGROUND

In microelectronics device fabrication there is a need to fill narrow trenches having aspect ratios (AR) greater than 10:1 for many applications. One application is for multicolor patterning, where trenches of from about 20 nm to about 30 nm need to be filled. For this application, the film needs to be of high quality throughout the trench (having, for example, a wet etch rate ratio less than two) with very low leakage. As the dimensions of the structures decrease and the aspect ratios increase, post curing methods of the as deposited flowable films become difficult. Resulting in films with varying composition throughout the filled trench.

Conventional spin-on dielectric films, e.g. silicon nitride (SiN), have high shrinkage and can cause bending to the structure it fills. Conventional low temperature chemical vapor deposition (CVD) silicon nitride films have a low density, are not stable in air, and oxidize quickly, converting to silicon oxynitride (SiON) films, compromising its etch selective to silicon oxide (SiO).

Flowable chemical vapor deposition (FCVD) has been widely used in advanced generations of semiconductor devices. As feature sizes decrease, the required gap fill volume of FCVD films can be reduced greatly compared to previous nodes (e.g. <500 Å or <300 Å). It is critical, but challenging, to deposit flowable films without bending the structure. Accordingly, there is a need for method of improving flowable gap fill films.

SUMMARY

One or more embodiments of the disclosure are directed to methods of depositing a film. In one or more embodiments, a method of depositing a film comprises: forming a flowable film on a substrate surface by exposing the substrate surface to a precursor and a reactant, the precursor having a structure of general formula (I) or general formula (II)

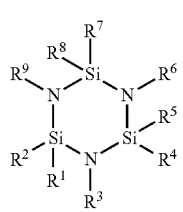

(I)

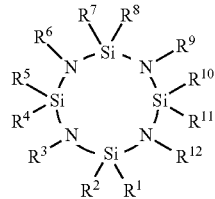

(II)

wherein $R^1$, $R^2$, $R^3$, $R^4$, $R^5$, $R^6$, $R^7$, $R^8$, $R^9$, $R^{10}$, $R^{11}$, and $R^{12}$ are independently selected from hydrogen (H), substituted or unsubstituted alkyl, substituted or unsubstituted alkoxy, substituted or unsubstituted vinyl, silane, substituted or unsubstituted amine, or halide; and exposing the substrate to a plasma.

Additional embodiments of the disclosure are directed to methods of depositing a film. In one or more embodiments, a method of depositing a film comprises: exposing a substrate in a processing chamber to a precursor having and structure of general formula (I) or general formula (II)

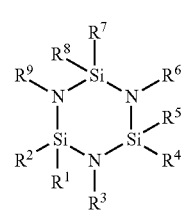

(I)

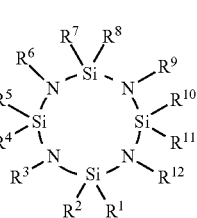

(II)

wherein $R^1$, $R^2$, $R^3$, $R^4$, $R^5$, $R^6$, $R^7$, $R^8$, $R^9$, $R^{10}$, $R^{11}$, and $R^{12}$ are independently selected from hydrogen (H), substituted or unsubstituted alkyl, substituted or unsubstituted alkoxy, substituted or unsubstituted vinyl, silane, substituted or unsubstituted amine, or halide to deposit a silicon-containing film on the substrate; exposing the substrate to a reactant to react with the silicon-containing film to form a silicon carbonitride (SiCN) film on the substrate; purging the processing chamber of the precursor and reactant; and exposing the substrate to a plasma.

Further embodiments of the disclosure are directed to non-transitory computer readable medium. In one or more embodiments, a non-transitory computer readable medium including instructions, that, when executed by a controller of a processing chamber, causes the processing chamber to perform operations of: flowing a precursor into a processing volume of the processing chamber having a substrate, the precursor having a structure of general formula (I) or general formula (II)

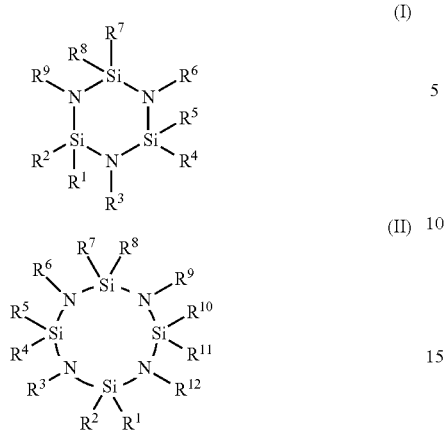

wherein $R^1, R^2, R^3, R^4, R^5, R^6, R^7, R^8, R^9, R^{10}, R^{11}$, and $R^{12}$ are independently selected from hydrogen (H), substituted or unsubstituted alkyl, substituted or unsubstituted alkoxy, substituted or unsubstituted vinyl, silane, substituted or unsubstituted amine, or halide; flowing a reactant into the processing volume of the processing chamber, the reactant comprising trisilylamine (TSA); purging the processing chamber of the precursor and the reactant; exposing the substrate to a plasma; and purging the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
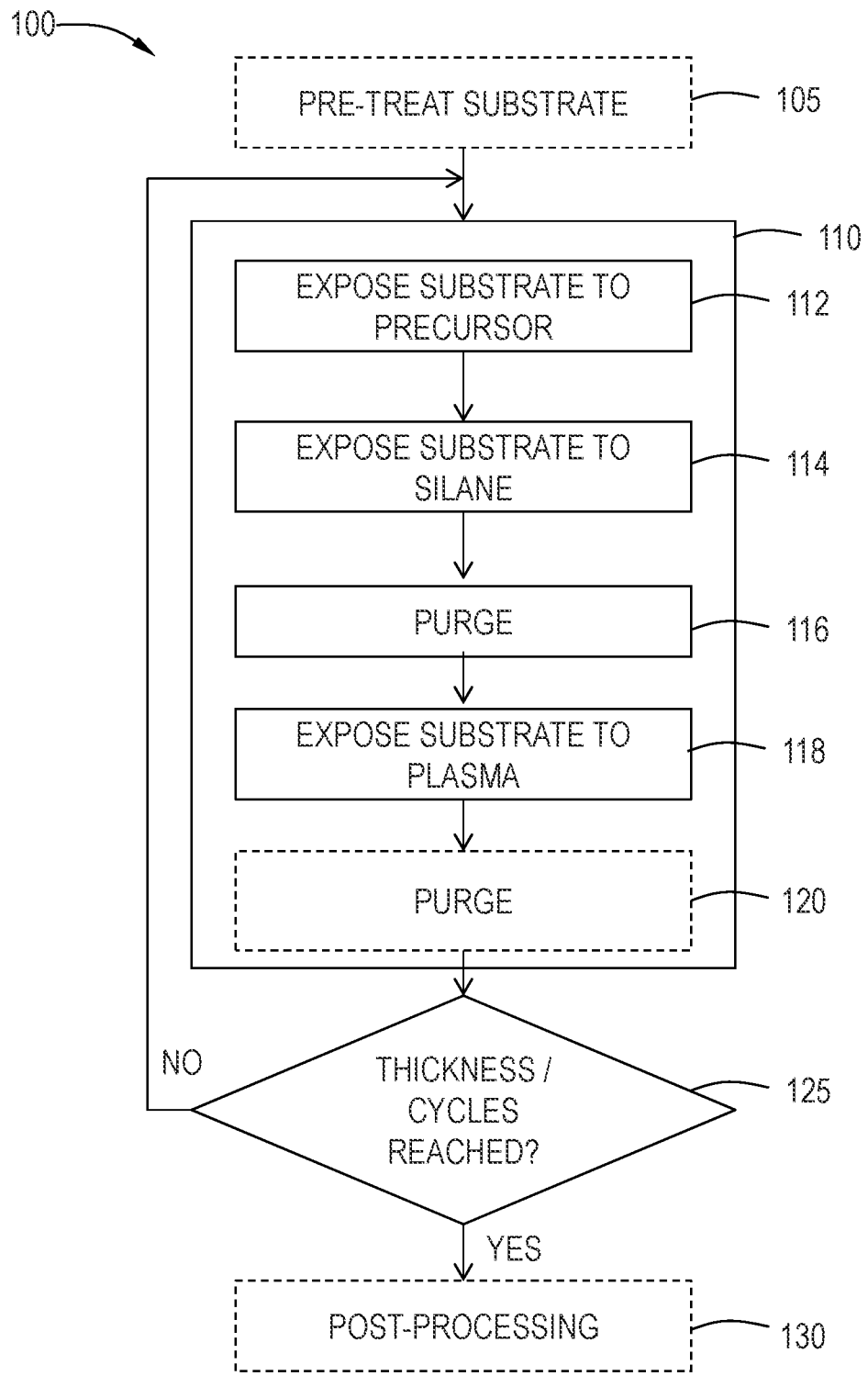
FIG. 1 illustrates a process flow diagram for a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

A "substrate," "substrate surface," or the like, as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

As used in this specification and the appended claims, the terms "precursor", "reactant", "reactive gas" and the like are used interchangeably to refer to any gaseous species that can react with the substrate surface.

In one or more embodiments, a bias power, thus generating a plasma, is advantageously added during the deposition or inserted into the layer by layer treatment of a silicon nitride (SiN) film to enhance the silicon nitride (SiN) quality. Additionally, in one or more embodiments, a cyclotrisilazane precursor is used to tune the carbon concentration of the deposited flowable film.

With reference to FIG. 1, one or more embodiments of the disclosure are directed to method 100 of depositing a film. The method illustrated in FIG. 1 is representative of plasma-enhanced process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of a layer (e.g. titanium nitride (TiN)).

At deposition operation 110, a process is performed to deposit a silicon carbonitride (SiCN) film on the substrate (or substrate surface). The deposition process can include one or more operations to form a film on the substrate. In operation 112, the substrate (or substrate surface) is exposed to a precursor to deposit a film on the substrate (or substrate surface). In one or more embodiments, the substrate (or substrate surface) is exposed to a precursor mixture comprising a silane and a precursor of general formula (I) or general formula (II). In one or more embodiments, the silane comprises one or more of trisilylamine (TSA), silane, disilane, trisilane, tetrasilane, higher order silanes, or substituted silanes.

In one or more embodiments, provided is a plasma-enhanced process for forming silicon carbonitride (SiCN) films, using organosilzane precursors. In one or more embodiments, the precursor has a structure corresponding to general formula (I) or general formula (II)

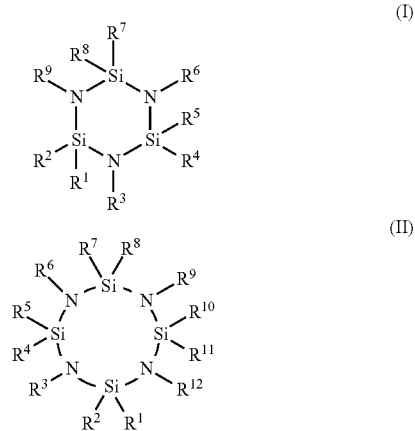

wherein $R^1$, $R^2$, $R^3$, $R^4$, $R^5$, $R^6$, $R^7$, $R^8$, $R^9$, $R^{10}$, $R^{11}$, and $R^{12}$ are independently selected from hydrogen (H), substituted or unsubstituted alkyl, substituted or unsubstituted alkoxy, substituted or unsubstituted vinyl, silane, substituted or unsubstituted amine, or halide.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

As used herein, the term "alkoxy" includes any of the above alkyl groups linked to an oxygen atom.

As used herein, the terms "vinyl" or "vinyl-containing" refer to groups containing the vinyl group (—CH═CH$_2$).

As used herein, the term "amine" relates to any organic compound containing at least one basic nitrogen atom, e.g. NR'$_2$, wherein R' is independently selected from hydrogen (H) or alkyl.

As used herein, the term "silane" refers to a compound SiR'$_3$, wherein R' is independently selected from hydrogen (H) or alkyl.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

In one or more embodiments, the precursor comprises a mixture of a silane (e.g. trisilylamine (TSA), silane, disilane, trisilane, tetrasilane, higher order silanes, or substituted silanes) and one or more of hexamethylcyclotrisilazane, octamethylcyclotrisilazane, nonamethylcyclotrisilazane, hexaethylcyclotrisilazane, octaethylcyclotrisilazane, 2-ethyl-2,4,4,6,6-pentamethyl-1,3,5,2,4,6-triazatrisilinane, hexapropylcyclotrisilazane, octapropylcyclotrisilazane, Di(butan-2-yl)-fluoro-(2,2,4,4,6,6-hexamethyl-1,3,5,2,4,6-triazatrisilinan-1-yl)silane, Tetraethyl-dimethyl-triazatrisilinane, Diethyl-tetramethyl-triazatrisilinane, hexapropyltriazatrisilinane, hexamethyltriazatrisilinane, hexaethyltriazatrisilinane, octapropyltriazatrisilinane, octaamethyltriazatrisilinane, octaethyltriazatrisilinane, tetraethyl-tetramethyl-triazatrisilinane, ethyl-pentamethyl-triazatrisilinane, triethyl-triazatrisilinane, trimethyl-triazatrisilinane, tripropyl-triazatrisilinane, and the like. In some specific embodiments, the precursor comprises one or more of hexamethylcyclotrisilazane, hexaethylcyclotrisilazane, hexapropylcyclotrisilazane, octamethylcyclotrisilazane, octaethylcyclotrisilazane, octapropylcyclotrisilazane. In a very specific embodiment, the precursor comprises hexamethylcyclotrisilazane or octamethylcyclotrisilazane.

In one or more embodiments, the precursor consists essentially of a mixture of a silane (e.g. silane, disilane, trisilane, tetrasilane, higher order silanes, or substituted silanes) and one or more of hexamethylcyclotrisilazane, octamethylcyclotrisilazane, nonamethylcyclotrisilazane, hexaethylcyclotrisilazane, octaethylcyclotrisilazane, 2-ethyl-2,4,4,6,6-pentamethyl-1,3,5,2,4,6-triazatrisilinane, hexapropylcyclotrisilazane, octapropylcyclotrisilazane, Di(butan-2-yl)-fluoro-(2,2,4,4,6,6-hexamethyl-1,3,5,2,4,6-triazatrisilinan-1-yl)silane, Tetraethyl-dimethyl-triazatrisilinane, Diethyl-tetramethyl-triazatrisilinane, hexapropyltriazatrisilinane, hexamethyltriazatrisilinane, hexaethyltriazatrisilinane, octapropyltriazatrisilinane, octaamethyltriazatrisilinane, octaethyltriazatrisilinane, tetraethyl-tetramethyl-triazatrisilinane, ethyl-pentamethyl-triazatrisilinane, triethyl-triazatrisilinane, trimethyl-triazatrisilinane, tripropyl-triazatrisilinane, and the like. In some specific embodiments, the precursor consists essentially of one or more of hexamethylcyclotrisilazane, hexaethylcyclotrisilazane, hexapropylcyclotrisilazane, octamethylcyclotrisilazane, octaethylcyclotrisilazane, octapropylcyclotrisilazane. In a very specific embodiment, the precursor consists essentially of hexamethylcyclotrisilazane or octamethylcyclotrisilazane. As used in this manner, the term "consists essentially of" means that the silicon precursor comprises greater than or equal to about 95%, 98%, 99% or 99.5% of one or more of hexamethylcyclotrisilazane, octamethylcyclotrisilazane, nonamethylcyclotrisilazane, hexaethylcyclotrisilazane, octaethylcyclotrisilazane, 2-ethyl-2,4,4,6,6-pentamethyl-1,3,5,2,4,6-triazatrisilinane, hexapropylcyclotrisilazane, octapropylcyclotrisilazane, Di(butan-2-yl)-fluoro-(2,2,4,4,6,6-hexamethyl-1,3,5,2,4,6-triazatrisilinan-1-yl)silane, Tetraethyl-dimethyl-triazatrisilinane, Diethyl-tetramethyl-triazatrisilinane, hexapropyltriazatrisilinane, hexamethyltriazatrisilinane, hexaethyltriazatrisilinane, octapropyltriazatrisilinane, octaamethyltriazatrisilinane, octaethyltriazatrisilinane, tetraethyl-tetramethyl-triazatrisilinane, ethyl-pentamethyl-triazatrisilinane, triethyl-triazatrisilinane, trimethyl-triazatrisilinane, tripropyl-triazatrisilinane, and the like, on a molecular basis. The presence of diluent, carrier and/or inert gases, for example, is not taken into consideration in the calculation.

In one or more embodiments, the deposition process is carried out at temperatures ranging from about 0° C. to about 400° C., including about 25° C., about 50° C., about 75° C., about 100° C., about 125° C., about 150° C., about 175° C., about 200° C., about 425° C., about 250° C., about 275° C., about 300° C., about 325° C., about 350° C., about 375° C., and about 400° C.

In one or more embodiments, the substrate (or substrate surface) can be any suitable surface. Suitable surfaces include, but are not limited to, silicon (Si), silicon dioxide ($SiO_2$), silicon oxide ($SiO_x$), silicon oxycarbide (SiOC), platinum (Pt), titanium nitride (TiN), tantalum nitride (TaN), copper (Cu), cobalt (Cu), tungsten (W), ruthenium (Ru), molybdenum (Mo), or combinations thereof.

At operation 114, the substrate (or substrate surface) is exposed to a reactant to form a silicon carbonitride (SiCN) film on the substrate. In one or more embodiments, the reactant comprises ammonia or other precursors containing an amino group.

In some embodiments, operations 112 and 114 are performed simultaneously such that the substrate is exposed to the precursor and the reactant at the same time. In other embodiments, operations 112 and 114 are performed sequentially such that the substrate is first exposed to the precursor and is the exposed to the reactant.

At operation 116, the processing chamber is purged to remove unreacted precursor, unreacted reactant, reaction products, and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the rhenium precursor by any suitable technique including, but not limited to, moving the substrate through a gas curtain to a portion or sector of the processing chamber that contains none or substantially none of the rhenium precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

In one or more embodiments, the deposition process comprises a remote plasma enhanced chemical vapor deposition process (PECVD). After forming silicon carbonitride (SiCN) film on the substrate, the substrate is exposed to a plasma at operation 118. In one or more embodiments, exposing the silicon carbonitride (SiCN) film to a plasma in the processing chamber improves film properties. For example, in one or more embodiments, the wet etch rate is improved, indicating that the density of the film has been enhanced by plasma treatment. In one or more embodiments, the plasma comprises one or more of nitrogen ($N_2$), argon (Ar), helium (He), hydrogen ($H_2$), carbon monoxide (CO), or carbon dioxide ($CO_2$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

At operation 120, the processing chamber is purged after exposure to the plasma. Purging the processing chamber in operation 120 can be the same process or different process than the purge in operation 116. Purging the processing chamber, portion of the processing chamber, area adjacent the substrate surface, etc., removes plasma, reaction products and by-products from the area adjacent the substrate surface.

At decision point 125, in one or more embodiments, the thickness of the deposited film, or number of cycles of precursor and reactant is considered. In one or more embodiments, if the deposited film has reached a predetermined thickness or a predetermined number of process cycles have been performed, the method 100 moves to a post-processing operation 130. In one or more embodiments, if the thickness of the deposited film or the number of process cycles has not reached the predetermined threshold, the method 100 returns to deposition operation 110 to expose the substrate surface to the precursor again in operation 112, and continuing.

In one or more embodiments, the post-processing operation 130 comprises, for example, a process to modify film properties (e.g., annealing) or a further film deposition process (e.g., additional ALD or CVD processes) to grow additional films. In some embodiments, the post-processing operation 130 is process that modifies a property of the deposited film. In some embodiments, the post-processing operation 130 comprises annealing the as-deposited film. In some embodiments, annealing is performed at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. In one or more embodiments, annealing is performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 100 can be performed at any suitable temperature depending on, for example, the precursor, reactant agent or thermal budget of the device. In some embodiments, exposures to the precursor (operation 112) and the reactant (operation 114) occur at the same temperature. In some embodiments, the substrate is maintained at a temperature in a range of about 0° C. to about 400° C., or in the range of about 0° C. to about 100° C. to obtain a flowable film.

In some embodiments, exposure to the precursor (operation 112) occurs at a different temperature than the exposure to the reactant (operation 114). In some embodiments, the substrate is maintained at a first temperature in a range of about 0° C. to about 200° C. for the exposure to the precursor, and at a second temperature in the range of about 200° C. to about 500° C. for exposure the reactant. In such embodiments, two chambers may be needed in the mainframe.

In the embodiment illustrated in FIG. 1, deposition operation 110 the substrate (or substrate surface) is exposed to the precursor and the reactant sequentially. In another, un-illustrated, embodiment, the substrate (or substrate surface) is exposed to the precursor and the reactant simultaneously in a PE-CVD reaction. In a PE-CVD reaction, the substrate (or substrate surface) is exposed to a gaseous mixture of the precursor and reactant to deposit a silicon carbonitride (SiCN) film having a predetermined thickness. In the PECVD reaction, a silicon carbonitride (SiCN) film can be deposited in one exposure to the mixed reactive gas, or can be multiple exposures to the mixed reactive gas with purges between.

In one or more embodiments, the deposition process is carried out in a process volume at pressures ranging from 0.1 mTorr to 10 Torr, including a pressure of about 0.1 mTorr, about 1 mTorr, about 10 mTorr, about 100 mTorr, about 500 mTorr, about 1 Torr, about 2 Torr, about 3 Torr, about 4 Torr, about 5 Torr, about 6 Torr, about 7 Torr, about 8 Torr, about 9 Torr, and about 10 Torr.

The precursor-containing gas mixture may further include one or more of a dilution gas selected from helium (He), argon (Ar), xenon (Xe), nitrogen ($N_2$), or hydrogen ($H_2$). The dilution gas of some embodiments comprises a compound that is inert gas relative to the reactants and substrate materials.

The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of dielectric. In some embodiments, the plasma is a capacitively coupled plasma (CCP). In some embodiments, the plasma is an inductively coupled plasma (ICP). In some embodiments, the plasma is a microwave plasma.

In one or more embodiments, the silicon carbonitride (SiCN) film has a carbon content of greater than or equal to about 5%, 7.5%, 10%, 12.5%, 15%, 20%, 25% or 30%, on an atomic basis. In some embodiments, the silicon carbonitride (SiOCN) film comprises a carbon content in the range of about 0.1% to about 30%, or in the range of about 3% to about 25%, or in the range of about 4% to about 20%, on an atomic basis.

The deposition operation 110 can be repeated to form a silicon carbonitride (SiCN) film having a predetermined thickness. In some embodiments, the deposition operation 110 is repeated to provide a silicon carbonitride (SiCN) film having a thickness greater than about 0.1 nm, or in the range of from about 0.1 nm to about 1000 nm, including from about 10 nm to about 500 nm, from about 10 nm to about 100 nm, from about 5 nm to about 50 nm, from about 10 nm to about 50 nm, or from about 20 nm to about 30 nm.

In some embodiments, the film is deposited in a chamber with the substrate pedestal maintained at about 300° C., and the pressure maintained at about 5 Torr, with plasma generated at the wafer level (i.e., a direct plasma) by applying a bias of about 200 Watts to the electrostatic chuck. In some embodiments, an additional RF power of about 1000 Watts at 2 MHz is also delivered to the electrostatic chuck, generating a dual-bias plasma at the wafer level.

In general, the following exemplary deposition process parameters may be used to form the as-deposited film. The wafer temperature may range from about 200° C. to about 500° C. The chamber pressure may range from a chamber pressure in a range of about 0.1 mTorr to about 10 Torr. The flow rate of the precursor-containing gas mixture may be in a range from about 10 sccm to about 1,000 sccm. The flow rate of a dilution gas may individually range from about 50 sccm to about 50,000 sccm.

The film may be deposited to a thickness in a range of about 5 Å to about 60,000 Å, including a range of about 300 Å to about 10,000 Å, a range of about 2000 Å to about 3000 Å, or a range of about 5 Å to about 200 Å.

Figure 2:
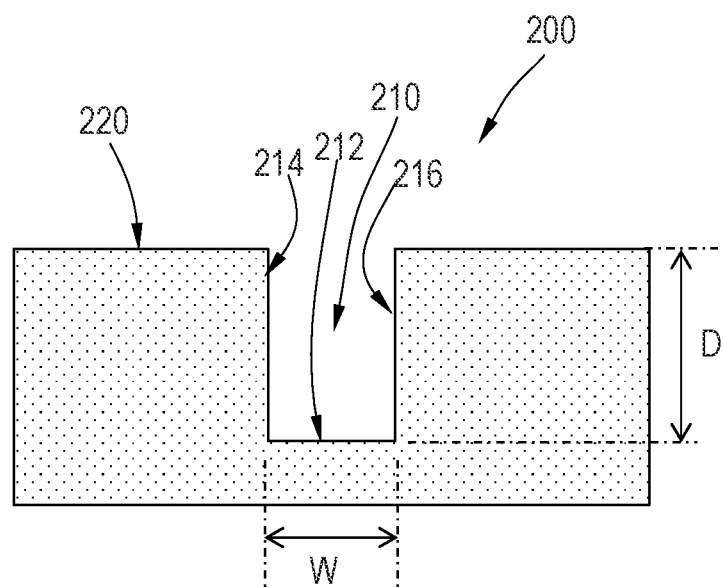
FIG. 2 illustrates a cross-section view of a substrate according to one or more embodiments.

FIG. 2 illustrates a cross-sectional view of a substrate 200 with a feature 210. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 200 has a substrate surface 220. The at least one feature 210 forms an opening in the substrate surface 220. The feature 210 extends from the substrate surface 220 to a depth D to a bottom surface 212. The feature 210 has a first sidewall 214 and a second sidewall 216 that define a width W of the feature 210. The open area formed by the sidewalls and bottom are also referred to as a gap.

One or more embodiments of the disclosure are directed to processing methods in which a substrate surface with at least one feature thereon is provided. As used in this regard, the term "provided" means that the substrate is placed into a position or environment for further processing.

Figure 3:
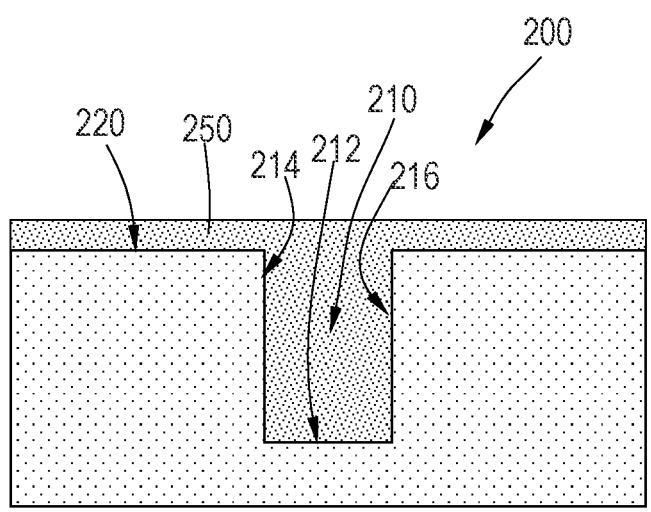
FIG. 3 illustrates a cross-section view of a substrate according to one or more embodiments.

FIG. 3 illustrates a cross-sectional view of a substrate 200 with a feature 210. As shown in FIG. 3, a flowable film 250 is formed on the substrate surface 220 and the first sidewall 214, second sidewall 216 and bottom surface 212 of the at least one feature 210. The flowable film 250 fills the at least one feature 210 so that substantially no seam is formed. A seam is a gap that forms in the feature between, but not necessarily in the middle of, the sidewalls of the feature 210. As used in this regard, the term "substantially no seam" means that any gap formed in the film between the sidewalls is less than about 1% of the cross-sectional area of the sidewall.

The flowable film 250 can be formed by any suitable process. In some embodiments, the forming the flowable film is done by plasma-enhanced chemical vapor deposition (PECVD). Stated differently, the flowable film can be deposited by a plasma-enhanced chemical vapor deposition process, or by using a remote plasma.

The PECVD process of some embodiments comprises exposing the substrate surface to a reactive gas. The reactive gas can include a mixture of one or more species. For example, the reactive gas may comprise a precursor of general formula I and a silane mixed with the precursor of general Formula I or general Formula II. In one or more embodiments, the silence comprises one or more of silane, disilane, trisilane, tetrasilane, higher order silanes, substituted silanes, or trisilylamine (TSA). The plasma gas can be any suitable gas that can be ignited to form a plasma and/or can act as a carrier or diluent for the precursor. In one or more embodiments, the plasma gas comprises ammonia ($NH_3$), and the ammonia is used a plasma treatment to activate one or more of the precursors.

Accordingly, one or more embodiments of the disclosure are directed to processing methods to deposit a silicon nitride film with a carbon content greater than 0% on an atomic basis. The processing method comprises exposing a substrate or substrate surface to a first reactive gas and a second reactive gas in a plasma enhanced deposition process where the reactive gases are exposed separately to the substrate.

Referring to FIG. 3, the flowable film 250 can be formed at any suitable temperature. In some embodiments, the flowable film 250 is formed at a temperature in the range of about 0° C. to about 200° C. The temperature can be kept low to preserve the thermal budget of the device being formed.

The composition of the flowable film can be adjusted by changing the composition of the reactive gas. In some embodiments, the flowable film comprises one or more of SiCN, SiCON, and SiN. To form an oxygen containing film, the co-reactant may comprise, for example, one or more of oxygen, ozone or water. To form a nitrogen containing film, the co-reactant may comprise, for example, one or more of ammonia, hydrazine, $NO_2$ or $N_2$. Those skilled in the art will understand that combinations of or other species can be included in the reactive gas mixture to change the composition of the flowable film.

In one or more embodiments, the flowable CVD film deposits on the wafer (temperature of the wafer can be from −10° C. to 600° C.) and due to their flowability, polymers flow through trenches and make a gap-fill. Then these films are subjected curing steps such as ozone/UV/steam annealing/$NH_3$ annealing to get stable films. In one or more embodiments, after formation of the flowable CVD film 250, the film is cured to solidify the flowable CVD film and form a substantially seam-free gapfill. In one or more embodiments, curing the flowable CVD film comprises exposing the flowable CVD film to one or more of ozone, UV light, steam annealing, ammonia annealing and oxygen plasma. In some embodiments, the flowable CVD film is cured by exposing the film to a UV curing process. The UV curing process can occur at a temperature in the range of about 10° C. to about 550° C. In one or more embodiments, the UV curing process occurs for any suitable time frame necessary to sufficiently solidify the flowable CVD film. In one or more embodiments, the UV cure is performed with different parameters, e.g., power, temperature, environment.

In some embodiments, curing the flowable CVD film comprises thermal annealing. In one or more embodiments, thermal annealing occurs at any suitable temperature and in any suitable environment.

In some embodiments, curing the flowable CVD film comprises exposure to a plasma or an electron beam. In one or more embodiments, plasma exposure to cure the film comprises a plasma separate from the PECVD plasma. In one or more embodiments, the plasma species and processing chamber are the same and, in other embodiments, the plasma cure is a different step than the PECVD process.

In some embodiments, curing the flowable CVD film comprises exposing the flowable CVD film to a steam anneal and/or oxygen plasma. In one or more embodiments, the use of a steam anneal and/or oxygen plasma reduces the carbon content of the flowable CVD film so that the cured film has a lower carbon content than the as-deposited flowable CVD film. In one or more embodiments, the use of steam anneal and/or oxygen plasma converts the deposited flowable SiCN, or SiOCN film to SiO.

In some embodiments, the silane, disilane, trisilane, tetrasilane, higher order silanes, substituted silanes, or trisilylamine (TSA) reactant is used with another precursor (e.g. co-flow with another Si-containing precursor) in a flowable process to deposit films of various compositions.

In some embodiments, the flowable CVD film is doped with another element. For example, in one or more embodiments, the flowable CVD film is doped with one or more of boron (B), arsenic (As), or phosphorous (P). In one or more embodiments, the flowable CVD films are doped with elements such as boron (B) and phosphorous (P) to improve film properties. In one or more embodiments, precursors containing boron and phosphorous are either co-flowed with the precursor of general formula I and trisilylamine (TSA) during the deposition process or are infiltrated after the deposition is done.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition, plasma treatment, UV curing, and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, a non-transitory computer readable medium including instructions, that, when executed by a controller of a processing chamber, causes the processing chamber to perform operations of: flowing a precursor into a processing volume of the processing chamber having a substrate, the precursor having a structure of general formula (I) or general formula (II)

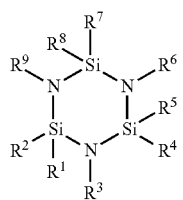

(I)

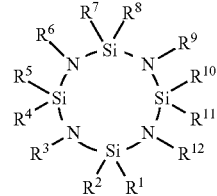

(II)

wherein $R^1$, $R^2$, $R^3$, $R^4$, $R^5$, $R^6$, $R^7$, $R^8$, $R^9$, $R^{10}$, $R^{11}$, and $R^{12}$ are independently selected from hydrogen (H), substituted or unsubstituted alkyl, substituted or unsubstituted alkoxy, substituted or unsubstituted vinyl, silane, substituted or unsubstituted amine, or halide; flowing a reactant into the processing volume of the processing chamber, the reactant comprising trisilylamine (TSA); purging the processing chamber of the precursor and the reactant; exposing the substrate to a plasma; and purging the processing chamber.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

A silicon carbonitride film was deposited on a substrate. Hexamethylcyclotrisilazane (HMCTZ) and trisilylamine (TSA) in a ratio of about 3.6:1 were coflowed into a reaction chamber in a carrier gas of helium (g), followed by flowing a stream of ammonia ($NH_3$) over the substrate and turning on the bias power at about 3000 W to generate a plasma. The substrate was then treated with an ammonia plasma in an atmosphere of Ar(g) at a pressure of about 0.7 T for about 15 seconds. A silicon carbonitride film was deposited on the substrate. A flow of argon (Ar) was then passed over the substrate for 30 seconds. The substrate was annealed at 400° C., at a pressure of 5 T, in an atmosphere of nitrogen ($N_2$) for 10 minutes.

Example 2

A silicon carbonitride film was deposited on a substrate. Hexamethylcyclotrisilazane (HMCTZ) and trisilylamine (TSA) in a ratio of about 3.6:1 were coflowed into a reaction chamber in a carrier gas of helium (g), followed by flowing a stream of ammonia (NH3) over the substrate and turning on the bias power at about 3000 W to generate a plasma. A silicon carbonitride film was deposited on the substrate. A flow of argon (Ar) at about 0.7 T was then passed over the substrate for 30 seconds. The substrate was annealed at 400° C., at a pressure of 5 T, in an atmosphere of nitrogen ($N_2$) for 10 minutes.

Example 3

A silicon carbonitride film was deposited on a substrate. Hexamethylcyclotrisilazane (HMCTZ) and trisilylamine (TSA) in a ratio of about 3.6:1 were coflowed into a reaction chamber in a carrier gas of helium (g), followed by flowing a stream of ammonia ($NH_3$) over the substrate and turning on the bias power at about 3000 W to generate a plasma. A silicon carbonitride film was deposited on the substrate. The substrate was annealed at 400° C., at a pressure of 5 T, in an atmosphere of nitrogen (N₂) for 10 minutes.

Table 1 shows the characterization of the films.

TABLE 1

| Film Properties | Example 1 | Example 2 | Example 3 |
|---|---|---|---|
| Gapfill | Flowable | Flowable | Flowable at low bias |
| Refractive Index | 1.87 | 1.81 | 1.51 |
| Composition (Surface XPS) | — | 37/6.7/31/22/2.9 Si/C/N/O/F | 40/10.5/20.28/1.2 Si/C/N/O/F |

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
   forming a flowable film on a substrate surface by exposing the substrate surface to a precursor mixture, the precursor mixture comprising a silane and a precursor having a structure of general formula (II)

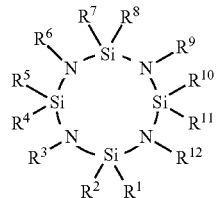

(II)

wherein $R^1$, $R^2$, $R^3$, $R^4$, $R^5$, $R^6$, $R^7$, $R^8$, $R^9$, $R^{10}$, $R^{11}$, and $R^{12}$ are independently selected from substituted or unsubstituted alkoxy, substituted or unsubstituted vinyl, or halide;
   flowing a stream of ammonia (NH₃) over the substrate surface; and
   turning on a bias power to generate a plasma,
   wherein the flowable film has a carbon content of at least 5 at. %.

2. The method of claim 1, wherein the silane comprises one or more of trisilylamine (TSA), silane, disilane, trisilane, tetrasilane, higher order silanes or substituted silanes.

3. The method of claim 1, wherein the flowable film has a thickness in a range of about 50 Å to about 1000 Å.

4. The method of claim 1, wherein the flowable film is formed at a pressure in a range from about 0.3 Torr to about 10 Torr.

5. The method of claim 1, wherein the flowable film is formed at a temperature in a range of from about 0° C. to about 200° C.

6. The method of claim 1, wherein the flowable film is a silicon carbonitride (SiCN) film.

7. The method of claim 1, wherein the precursor mixture has a precursor:silane ratio of about 3.6:1.

8. The method of claim 1, wherein turning on the bias power to generate the plasma comprises generating a direct plasma by applying a bias of about 200 Watts to an electrostatic chuck.

9. The method of claim 8, further comprising applying an additional RF power of about 1000 Watts at 2 MHz to the electrostatic chuck to generate a dual-bias plasma at the wafer level.

10. A method of depositing a film, the method comprising:
    exposing a substrate in a processing chamber to a precursor having a structure of general formula (II)

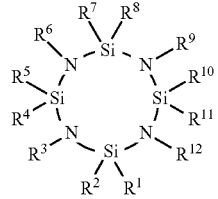

(II)

wherein $R^1$, $R^2$, $R^3$, $R^4$, $R^5$, $R^6$, $R^7$, $R^8$, $R^9$, $R^{10}$, $R^{11}$, and $R^{12}$ are independently selected from substituted or unsubstituted alkoxy, substituted or unsubstituted vinyl, silane, or halide to deposit a silicon-containing film on the substrate;
    exposing the substrate to a silane to react with the silicon-containing film to form a silicon carbonitride (SiCN) film on the substrate, the SiCN film having a carbon content of at least 5 at. %;
    purging the processing chamber of the precursor and silane;

flowing a stream of ammonia (NH$_3$) over the substrate surface; and turning on a bias power to generate a plasma.

11. The method of claim 10, wherein the silane comprises one or more of trisilylamine (TSA), silane, disilane, trisilane, tetrasilane, higher order silanes or substituted silanes.

12. The method of claim 10, wherein the substrate is exposed simultaneously to the precursor and the silane.

13. The method of claim 10, wherein purging the processing chamber comprises flowing a purge gas over the substrate, the purge gas selected from one or more of argon (Ar), nitrogen (N$_2$), and helium (He).

14. The method of claim 10, wherein turning on the bias power to generate the plasma comprises generating a direct plasma by applying a bias of about 200 Watts to an electrostatic chuck.

15. The method of claim 14, further comprising applying an additional RF power of about 1000 Watts at 2 MHz to the electrostatic chuck to generate a dual-bias plasma at the wafer level.

16. A non-transitory computer readable medium including instructions, that, when executed by a controller of a processing chamber, causes the processing chamber to perform operations of:

flowing a precursor mixture into a processing volume of the processing chamber having a substrate, the precursor mixture comprising a silane and a precursor having a structure of general formula (II)

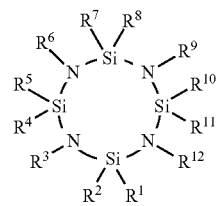

(II)

wherein $R^1$, $R^2$, $R^3$, $R^4$, $R^5$, $R^6$, $R^7$, $R^8$, $R^9$, $R^{10}$, $R^{11}$, and $R^{12}$ are independently selected from substituted or unsubstituted alkoxy, substituted or unsubstituted vinyl, or halide;

flowing a reactant into the processing volume of the processing chamber, the reactant comprising trisilylamine (TSA) to form a flowable film on the substrate, the flowable film having a carbon content of at least 5 at. %;

purging the processing chamber of the precursor and the reactant;

flowing a stream of ammonia (NH$_3$) over the substrate surface;

turning on a bias power to generate a plasma; and purging the processing chamber.

* * * * *